INVENTOR.
ERNEST G. BROCK
JACK E. TAYLOR

BY [signature]
ATTORNEY

INVENTOR.
ERNEST G. BROCK
JACK E. TAYLOR

BY Martin Kach
ATTORNEY

INVENTOR.
ERNEST G. BROCK
JACK E. TAYLOR
BY
ATTORNEY 3,521,073

LIGHT EMITTING SEMICONDUCTOR DIODE USING THE FIELD EMISSION EFFECT

Ernest G. Brock and Jack E. Taylor, Monroe, N.Y., assignors to General Dynamics Corporation, a corporation of Delaware Filed Nov. 26, 1965, Ser. No. 510,022
Int. Cl. H01s *3/09*
U.S. Cl. 250—217 7 Claims

ABSTRACT OF THE DISCLOSURE

A semi-conductor junction device is described for use as a light emitting device of incoherent or coherent light (laser action). A pair of electrodes are disposed adjacent to the device, each on opposite sides of the junction. One of the electrodes is spaced from one side of the device to provide a field emission anode and cathode arrangement which, in effect, is a field emission diode.

The present invention relates to radiation emitting devices and particularly to optical-electronic, semiconductor devices.

The present invention is especially suitable for use in the generation of modulated light or other radiation through the use of recombination radiation and/or stimulated emisison of radiation in semiconductor junction diodes.

The semiconductor junction diodes of the type which may be used in practicing this invention have been described in such publications as the IEEE Spectrum, vol. 2, number 7, July 1965, pages 62–75. Such semiconductor junction diodes require electrical pumping by the injection of charge carriers in order to emit radiation. In order that desired amounts of radiation are produced, it is necessary to inject charge carriers in large numbers. The current density needed to produce stimulated emission sufficient for laser action is even higher than that needed to produce recombination radiation. Most present day semiconductor junction diodes use ohmic contacts for the purpose of injecting charge carriers therein. Such contacts effectively present resistance in series with the diode. Heat generation at the contacts increases the temperature of the diodes and is deleterious to the generation of the radiation therein. It has been suggested to inject carriers by bombardment of the diode surfaces with high energy electron beams. Such bombardment can result in radiation damage and ultimately a degeneration of the light output or retardation of laser action. Moreover, spurious modulation may result because of uncontrolled secondary emission and thermal effects. Semiconductor junction diodes of the type which generate radiation are generally very small. Accordingly, the discrete connections by way of conductors making ohmic contact to the device can have a large amount of distributed reactance, which has a limiting effect on the frequency response of the device (viz. its ability to handle high frequency signals).

Accordingly, it is an object of the present invention to provide improved devices for generating radiation and in which the radiation may be modulated.

It is a further object of the present invention to provide an improved device for generating radiation by means of semiconductor radiation emitting diodes, which is not limited in efficiency by contact effects.

It is a still further object of the present invention to provide improved devices for generating radiation by means of radiation emitting semiconductor junction diodes which are capable of efficiently handling signals having high frequency, including frequencies in the microwave region of the spectrum.

It is a still further object of the present invention to provide improved semiconductor junction diode devices in which mechanical strains and other physical effects which are deleterious to the radiation emititng performance thereof are eliminated.

Brieflly described, a radiation emitting device embodying the invention includes a semiconductor junction diode which is operative to emit radiation from the junction thereof when current passes therethrough. A pair of electrodes are disposed adjacent to the diode, each on an opposite side of the junction. At least one of the electrodes is separate from the diode to provide a space discharge device and may provide a field emission anode. The side of the diode adjacent to this electrode is desirably shaped as in the form of a pointed tip, to provide a field emission cathode. The electrodes and the diode may be located in an evacuated housing. Potentials are applied to the electrodes, such that field emission is produced between the separated electrode and the diode and results in the injection of charge carriers therein sufficient to produce radiation and/or laser action. This field emisison may be modulated by varying the field emission producing potential in accordance with a modulating signal, or by varying the electromagnetic field which is established between the field emission cathode and the field emission anode. In addition to field emission, other processes in accordance with the invention may be provided for the injection of charge carriers into the diode. Such other processes may include secondary emission, photo emission and ion emission.

The invention itself, both as to its organization and method of operation, as well as additional objects and advantages thereof will become more readily apparent from a reading of the following description in connection with the accompanying drawings in which.

Figure 1:
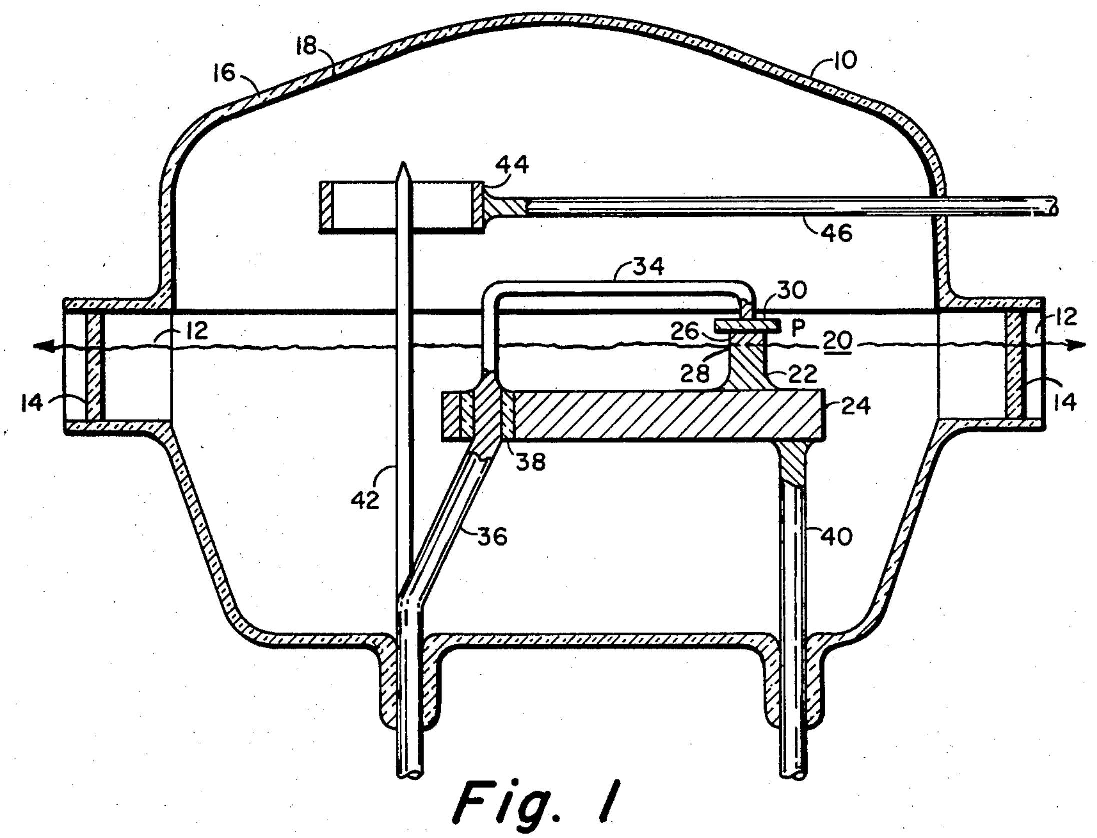
FIG. 1 is a sectional view of a radiation emitting device which embodies the invention.

Referring more particularly to FIG. 1, there is shown a housing 10, which may be made of glass or other insulating material and which may be evacuated. The housing has two ports 12, each having a transparent window 14 of glass, or the like, through which radiation in the form of light may be emitted. The interior surface of the upper portion 16 of the housing 10 has a coating of conductive material thereon. This coating 18 provides a field emission anode, as will be described more fully hereinafter.

A semiconductor junction diode 20 is located within the housing 10. This diode is illustrated as being N-type gallium arsenide wafer 22 (GaAs) which is mounted on a conductive slab 24. This conductive slab may be gold plated so as to provide a good ohmic contact between the lower surface of the wafer 22 and the slab 24. Zinc is diffused into the upper surface of the wafer 22, to provide a region 26 of P-type material which is separated from the N-type material by a junction 28, illustrated as a dashed line. It is from this junction that light is radiated when charge carriers pass through the diode. This junction is positioned opposite to the windows 14 so that light therefrom may penetrate the housing 10. A small layer of conductive material, such as gold, is deposited on the P-side of the diode 20. It will thus be observed that the diode has two surfaces on opposite sides of the junction. The side surface at the P-side of the junction has the gold layer 30 attached thereto, whereas the slab 24 is bonded to the N-side surface of the diode 20. The junction area is reduced in the illustrated diode by means of chemical etching, such that a rim of gold layer 30 extends somewhat beyond the P-type region. A conductor 34 is connected to the layer 30 and is connected to a lead 36 which passes through an aperture in the slab 24. This aperture is insulated from the slab by means of an insulating bushing 38 which may be of glass. Another lead 40 is connected to the slab 24. These leads 36 and 40 extend through the housing and provide support for the diode 20. It will be observed that this diode 20 has a pair of ohmic contacts by virtue of the bonded slab 24 and the layer 30. The contact provided by the layer 30 may be eliminated, as will be observed, as the description proceeds.

A wire 42 is connected to the lead 36. This wire 42 extends upwardly towards the conductive coating 18 and is terminated by a point-like tip, which may be made of tungsten. This tip provides a field-emission cathode.

A cylinder 44 of conductive material is disposed around the tip and is supported in this position by means of a lead 46 which extends through the housing and is available as a terminal. The conductive coating 18 makes contact with the lead 46. Accordingly, potentials applied to the lead 46 will also be applied to the coating.

A source of D.C. voltage, such as a power supply or battery, is connected between the lead 46 and the lead 40. This voltage establishes an electric field between the tip of the wire 42 and the electrode provided by the coating 18. At a sufficiently high potential, say approximately 1,000 volts, field emission occurs between the tip of the wire 42 and the electrode coating 18. Accordingly, current carrying free charges, in this case electrons, which are injected into the N region 22, pass through the junction and through the P region 26 and are carried by the leads 34, 36 and wire 42 to the tip of the wire 42, from which they emanate and pass through the vacuum interspace to the anode provided by the coating 18.

Photons are emitted as a result of the recombination of the injected free charges at the junction. This recombination radiation increases with increasing injection current. When a certain threshold is reached, for example in the range of 1,000 to 10,000 amperes per square centimeter in the small junction area, stimulated emission results. By providing reflective coatings on the sides of the diode which extend across the junction, this stimulated emission will result in laser action, and coherent light will radiate through the windows 14.

High current densities are readily available by virtue of field emission between the tip of the wire 42, which provides the electron-emitting cathode of the field-emitted diode and the coating 18 which provides a field-emission anode for collecting the electrons emitted at the tip 42. The field emission diode has very resistance and reduces heating of the diode. The electrons leaving the diode also have the effect of reducing its temperature.

Figure 2:
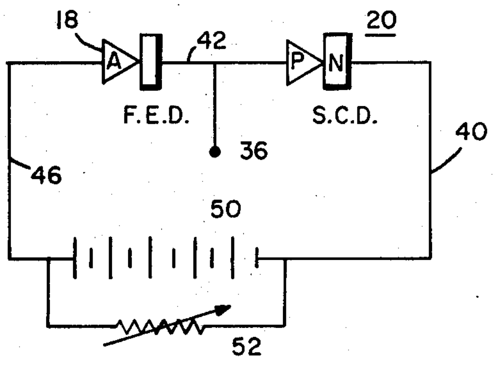
FIG. 2 is a schematic diagram of a circuit including the device shown in FIG. 1.

FIG. 2 schematically illustrates the field-emission diode (F.E.D.), having an anode electrode A, provided by the coating 18 and a cathode electrode provided by the wire 42. This field-emission diode is connected in series with the semiconductor diode (S.C.D.) 20. Both diodes are polarized in the same direction, that is, the cathode of the field-emission diode is connected to the anode of the semiconductor diode. It will be observed that the DC voltage source, as represented by a battery 50 which is shunted by a variable resistor 52 for controlling the current which flows through the diodes, is connected between the leads 40 and 46, such that positive potential is applied to the anode of the field emission diode and negative potential is applied to the cathode of the semiconductor diode. The lead 36, which is brought out of the housing 10 is illustrated as being available to permit direct excitation of the diode for observation of its electrical characteristics or to provide for operation thereof without the field emission diode.

Figure 4:
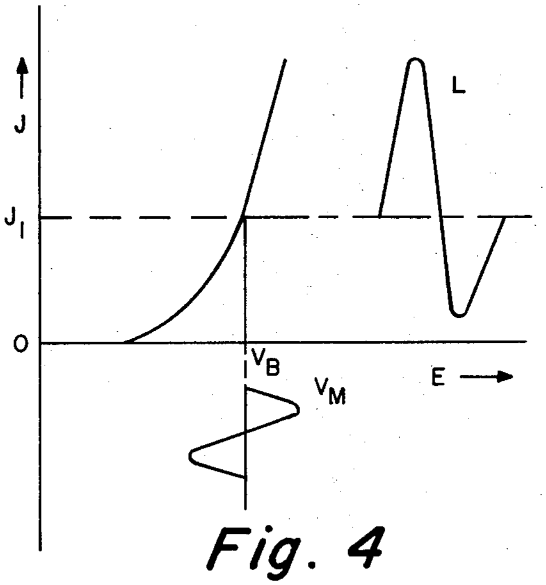
FIG. 4 is a graph showing the modulation process which takes place during operation of the device shown in FIG. 1, through the use of the circuit shown in FIG. 3.
Figure 3:
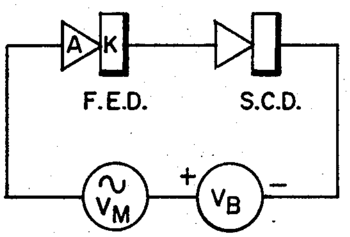
FIG. 3 is a schematic diagram similar to FIG. 2, including elements for modulating the radiation emitted by the device of FIG. 1.

In order to utilize the device shown in FIG. 1 for communication purposes, it is desirable to modulate the light emitted in accordance with the input signal. To this end, the series connected field emission diode and semiconductor diode are connected as shown in FIG. 3, to a source of D.C. biasing voltage $V_B$ which is connected in series with a source of modulating voltage $V_M$. The bias voltage $V_B$ is desirably sufficient to produce field emission between the anode and cathode of the field emission diode. This operating condition is illustrated in FIG. 4, which shows the voltage level $V_B$ as being sufficient to cause field emission at a current density $J_1$. The modulating voltage $V_M$ is superimposed upon the voltage level $V_B$ and modulates that level. The current that passes through the field emission diode is non-linearly related to the modulating voltage in the illustrated example, since the negative swing of the modulating voltage causes the field emission diode to operate in the non-linear region of its voltage current characteristic. The light output from the diode is a direct function of the density of the current passing through the semiconductor junction diode. Accordingly, the light output indicated at L in FIG. 4 is non-linear and contains higher harmonics of the modulating signal. The modulating signal may be of very high frequency, say of the microwave range. The higher harmonics of this signal would be of still higher frequency, and such higher harmonics would be modulated in accordance with the modulating signal $V_M$. The device, therefore, has as a feature the generation of higher frequency modulation than in the modulating signal itself by virtue of the operation of the field emission diode therein. It is, of course, possible to operate the field emission diode in the linear region of its characteristic so that the modulation will be more closely related in frequency to the modulating signal than is the case in FIG. 4. The higher frequency components of the modulated signal may be in the optical range and may be extracted by optical filters of the type known in the art.

Figure 5:
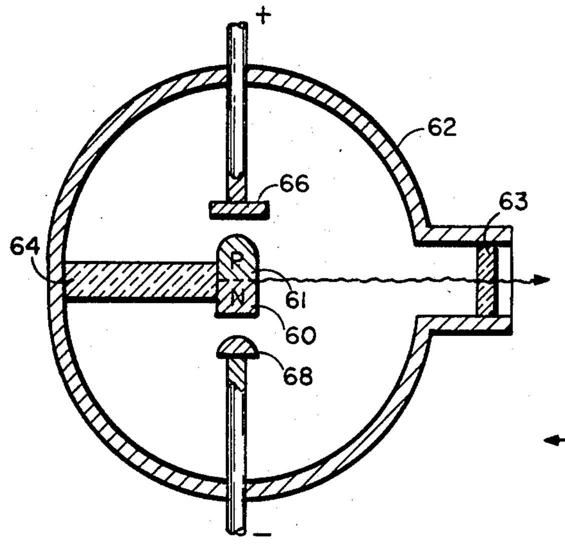
FIG. 5 is a sectional view which diagrammatically shows a radiation emitting, semiconductor junction diode device having a pair of field emission diodes which is provided in accordance with another embodiment of the invention.

In FIG. 5, a semiconductor junction diode 60 is supported within an envelope or housing 62 of insulating material by means of a bracket 64. The bracket is also of insulating material and may be attached to the diode at one side of the junction region thereof by cementing. There are no conductive contacts to the sides of the diode which are disposed on opposite sides of the junction 61.

Therefore, mechanical strain on the diode which may degrade its light-emitting performance or change the frequency of light emitted therefrom is avoided. One of the opposite sides of the diode has a tip which projects therefrom. This tip is made in the illustrated diodes by etching the diode. This point may desirably have a radius of curvature of the order of one micron.

Electrodes 66 and 68 are disposed adjacent to the tips which project from the P and N sides of the diode respectively. A source of potential may be connected between the electrodes 66 and 68. The electrode 66 is desirably connected to the positive terminal of the source, while the electrode 68 is connected to the negative terminal of the source. Field emission results between the tip of the electrode 68, which acts as a field emission cathode and the N-side of the diode 60 which acts as a field emission anode. The tip at the P-side of the diode 60 acts as a cathode of another field-emission diode, while the electrode 66 acts as an anode thereof. Accordingly, the device shown in FIG. 6 includes a pair of field-emission diodes respectively on opposite sides of the semiconductor junction diode 60. When the diode is operated, light is radiated through a window 63, which is formed in the housing 62. It is desirable that a reflective coating be provided at least at the wall of the diode which is connected to the bracket 64 so as to enhance emission of light through the window 63. Of course, if an optical resonant cavity is formed by providing reflective coatings on opposite sides of the junction region, laser action will be produced so long as the density of the current which flows through the field-emission diodes is above the threshold of the semiconductor junction diode for stimulated emission.

Figure 6:
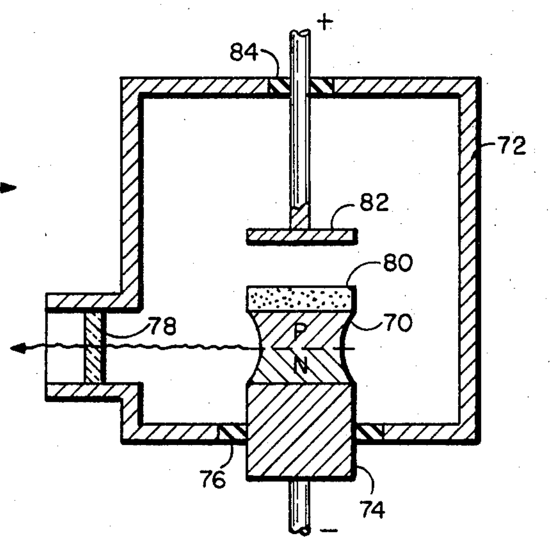
FIG. 6 is a diagrammatic sectional view of a light emitting semiconductor junction diode device including a thermionic emisison cathode which is in accordance with still another embodiment of the invention.

FIG. 6 shows a device which utilizes a semiconductor junction diode 70, which is supported within an evacuated envelope 72 by means of a heavy lead 74 which projects through an insulating seal 76 in the envelope 72. This manner of support eliminates mechanical strain in the diode as well as reactances which would lower its frequency range over which the device could operate. The junction of the diode 70 is disposed opposite to a window 78 in the envelope 72 so that light generated at the junction may be propagated therethrough. A coating of thermionically emitting material, such as a triple oxide (viz. BaO, SrO, and CaO) or thorium oxide, is disposed on the P-side of the diode 70. An anode electrode 82, which extends into the housing 72 through an insulating seal 84 is disposed adjacent to the coating 80. Operating potential may be applied between the anode electrode 82 and the lead 74. The positive terminal of the potential source, such as a battery, is connected to the anode 82. Thermionic emission from the cathode 80 may be initially stimulated through the use of an external heating source, such as an electrical heater, not shown in the envelope 72. However, once electron emission from the coating 80 is started, such emission increases as a function of the applied potential. This thermionic emission may be controlled by means of modulating the voltage applied between the electrode 82 and the lead 74 in order to modulate the light which is generated at the junction of the diode 70.

Figure 7:
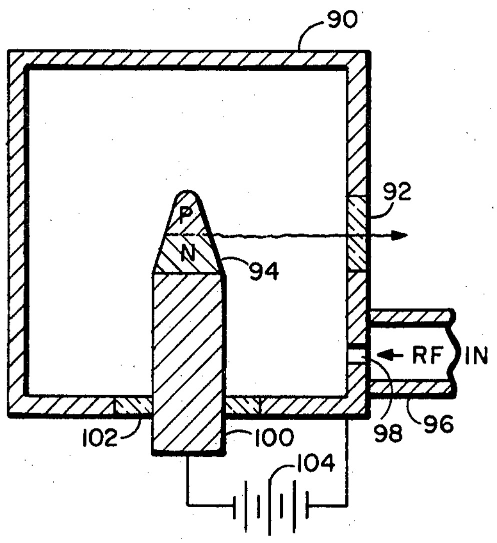
FIG. 7 is a sectional view which diagrammatically shows a light-emitting semiconductor junction diode device which is adapted to be modulated by microwave energy in accordance with a further embodiment of the invention.

FIG. 7 illustrates a light emitting device which takes advantage of the wide frequency response resulting from the elimination in large measure of small current-carrying conductors. A resonant cavity 90 is provided by means of a walled structure of conductive material. A window 92 is provided in the structure through which light may emanate from a semiconductor diode 94 contained therein. A wave guide 96, through which electromagnetic energy may be propagated is coupled to the device by way of a small aperture 98 therein. However, other coupling means, such as probes, may be used. The semiconductor diode 94 is supported on a relatively large conductor 100 which extends into the cavity 90 through an insulating seal 102. It is desirable that the cavity be evacuated in order to enhance field emission therein. A source of operating voltage indicated as a battery 104 is connected between the conductive walls of the cavity 90 and the conductor 100. In order to enhance field emission between the walls of the cavity adjacent to the diode 94 and the diode, it is desirable that the diode be tapered so as to have a point-like shape. This point-like shape is shown as being formed at the P-side of the diode.

Emission results due to the potential difference between the diode and the walls of the cavity which is established between the battery 104. The microwave energy modulates the field which is established by the battery such that the density of the current passes through the field emission diode and thence through the semiconductor diode; is modulated in accordance therewith. It may be desirable, however, to increase the radiation frequency power so as to provide a sufficiently intense electromagnetic field in the cavity as to cause field emission conduction between the diode 94 and the walls of the cavity without the use of the battery 104. Accordingly, the current which passes through the diode and causes the generation of light at the junction thereof would be derived entirely from the microwave energy which enters the cavity.

Figure 8:
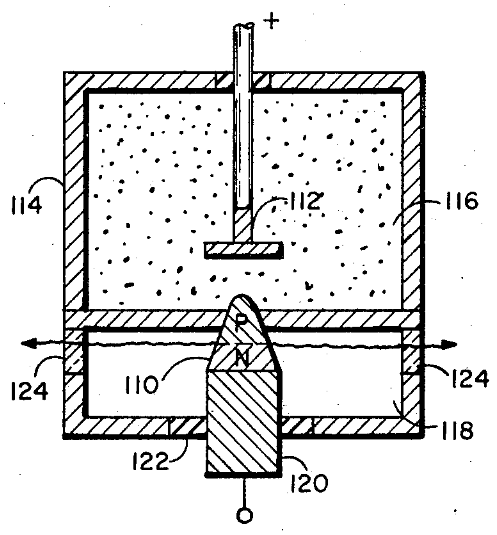
FIG. 8 is a sectional view diagrammatically showing a light emitting semiconductor junction diode device including a gas-discharge diode in accordance with a still further embodiment of the invention.

FIG. 8 illustrates the use of a gas discharge diode which has as its cathode, one side of a semiconductor diode 110, and as the other side, an electrode 112. The semiconductor diode is disposed in a bi-part housing 114. This housing has the chambers 116 and 118. The majority of the diode, including the junction region thereof, is suported in the cavity 118 by means of a conductor 120 which extends into the housing 114, through a conductive seal 122. Windows 124 are provided opposite to the junction of the diode 110 in order to allow the light which is generated in the diode to emanate from the housing.

The chamber 116 is filled with an ionizable gas, such as neon. This chamber is separate from the chamber 118 so that when the gas discharges, a conductive path is not established through the ionized gas between the P and N regions of the diode 110. Operating potential such as may be derived from a battery, is applied between the conductor 120 and the electrode 112. These potentials cause a discharge between the cathode provided by the diode 110 and the anode provided by the electrode 112. Electrons may then flow through the ionized gas between the diode and the electrode 112. The current may be controlled by means of a rheostat which shunts the battery, as was shown in FIG. 2. Accordingly, the density of the current passing through the junction, and the intensity of the light generated at the junction may be controlled.

Figure 9:
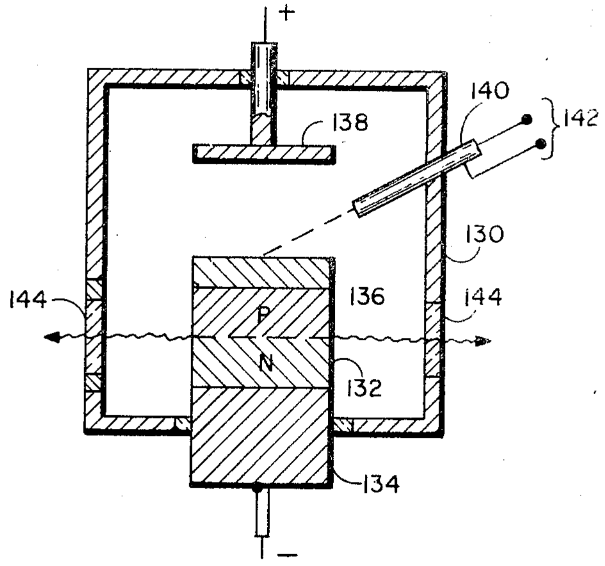
FIG. 9 is a sectional view diagrammatically showing a light-emitting semiconductor junction diode device, including a secondary emission diode in accordance with a still further embodiment of the invention.

Referring to FIG. 9, there is shown a housing 130, which is adapted to be evacuated. This housing encloses a semiconductor junction diode 132 which is supported on a conductor 134. The conductor is ohmically connected to the N-side of the diode. The P-side of the diode has a layer 136 of material having a high secondary emission characteristic. A suitable material is magnesium oxide or silver-cesium oxide. An electrode 138 is disposed within the housing 130 opposite to the layer 136. An electron gun 140 is disposed in one wall of the housing 130 and is aimed to direct a beam of electrons upon the layer 136. It should be noted that these electrons do not strike the diode material itself, but merely impinge upon the layer 136, which effectively protects the diode against radiation damage. Operating potentials for the electron gun 140 may be applied to terminals 142, which are connected thereto. The layer 136 therefore provides the cathode of a secondary emission diode, whereas the electrode 138 provides the anode thereof. The amount of current which is carried by the secondary emission diode provided by the layer 136 may be controlled by the operating potential which is applied between electrode 138 and conductor 134 and by the intensity of the electron beam 140. Accordingly, the amount of light which is radiated at the junction of the diode 132 may be controlled by modulating either or both of the electron gun and electrode potentials. The light which is generated at the junction of the diode 132 emanates from windows 144 which are provided in the housing.

Figure 10:
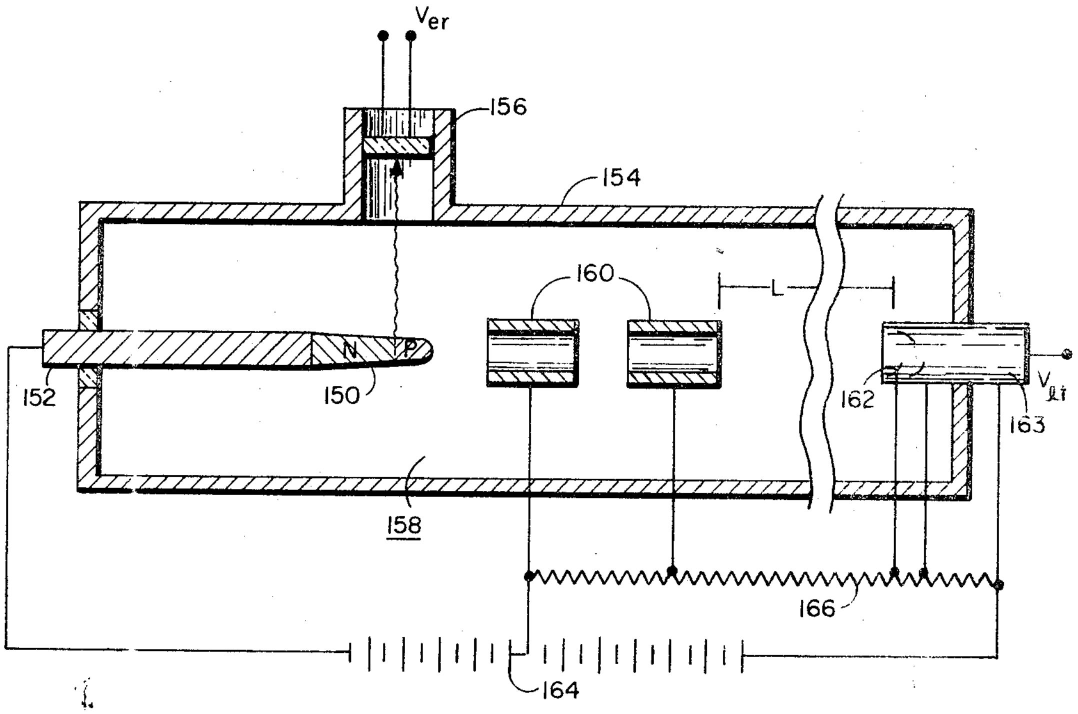
FIG. 10 is a sectional view diagrammatically showing an optical-electronic signal delay device in accordance with a still further embodiment of the invention.

FIG. 10 diagrammatically illustrates an optical-electronic delay device utilizing a semiconductor diode 150. This diode has an N region and a P region. The P region may have a tip projecting therefrom so as to provide the cathode of a field-emission diode, as was explained above. The N region is connected to a lead 152, which provides support for the diode 150. The lead supports the diode within a housing 154, which is adapted to be evacuated. The housing also includes an opto-electrical transducer 156, which is disposed not in proximity to the junction of the diode 150. This transducer 156 translates the light which is emitted from the junction into an electrical signal voltage indicated at $V_{er}$.

The device also includes an electron-optical structure 158 which includes a plurality of electron beam forming, cylindrical electrodes 160. These attract the electrons emitted from the cathode tip of the diode 150 and form them into a beam. The electron optical structure also includes a collector electrode 162, which is separated from the beam forming electrodes 160, by an electron drift space, having a length L. The collector electrode 162 is desirably the first electrode of an electron multiplier 163. Operating potentials for the device are provided by means of a source of direct current potential indicated as a battery 164. A voltage divider resistor 166 is connected across a portion of the battery and serves to provide progressively greater accelerating potentials at the beam forming electrodes and the collector electrode 162 so as to cause the beam to travel from the cathode at the P region of the diode 150 towards the collector electrode 162.

By virtue of the accelerating potentials and the distance L, the electrons emitting from the cathode at the tip of the diode 150 require a finite propagation time to reach the collector electrode at which these electrons are translated into an output voltage $V_{lt}$ by the electron multiplier 163. Inasmuch as the electrons which are emitted from the cathode tip region of the device cause light to be produced at the junction prior to their emission from the cathode region of the device, and inasmuch as these electrons are not collected at the collector electrode 162 until they propagate thereto, the output signal from the optical electrical transducer 156, namely $V_{er}$, occurs before the output signal from the collector 162 $V_{lt}$. The delay of $V_{lt}$, with respect to $V_{er}$, can be conveniently changed by changing the accelerating potential applied to the electron optical structure. In the event that delayed optical signals, rather than delayed electrical signals are desired, a phosphor screen may be located at the end of the electron optical structure so as to provide a light output in response to the electrons which have produced light at the junction and are propagated thereto. Thus, the light from the junction of the diode occurs first, followed by the light from the phosphor.

From the foregoing description, it will be apparent that there has been provided improved light emitting semiconductor diode devices which are readily adapted to provide modulated radiation over a very wide frequency range which extends into the microwave range and above. While several embodiments of the invention have been described, it should be understood that variations and modifications thereof within the spirit of the invention will undoubtedly suggest themselves to those skilled in the art. Accordingly, the description should be taken merely as illustrative and not in any limiting sense.

What is claimed is:

1. A radiation emitting device comprising
(a) an envelope,
(b) a semi-conductor junction diode within said envelope and having P and N portions on opposite sides of said junction,
(c) a first space discharge device contained in said envelope electrically connected in series with said diode, said first space discharge device having an anode physically spaced from said P portion of said diode and coupled thereto solely via a first space discharge path,
(d) a second space discharge device within said envelope comprising a cathode physically spaced from said N portion of said junction diode via a second space discharge path, said N portion providing the anode of said second space discharge device, and
(e) potential applying means for applying potential between said cathode of said second space discharge device and said anode of said first space discharge device for exciting the flow of electrons from said cathode of said second space discharge device, through said junction diode, to said anode of said first space discharge device whereby to excite the emission of radiation from said junction diode.

2. The invention as set forth in claim 1 wherein said cathode of said second discharge device faces said N portion of said junction diode and is point-like in shape.

3. A radiation emitting device comprising
(a) an envelope,
(b) a semi-conductor junction diode having P and N portions on opposite sides of said junction, said diode being located within said envelope, said P portion being coated with thermionically emitting material,
(c) a space discharge device contained in said envelope, said space discharge device having an anode electrode physically spaced from said coated P portion of said diode and coupled thereto solely via a space discharge path, and
(d) means for applying potential between said N portion of said diode and said anode electrode for exciting the flow of electrons from said N portion to said anode through said coated P portion and said space discharge path whereby to excite the emission of radiation from said junction diode.

4. A radiation emitting device comprising
(a) an envelope of conductive material which provides a cavity resonant at microwave frequency,
(b) a semi-conductor junction diode supported in insulating relationship with said cavity and spaced from the walls thereof, said junction diode having P and N portions on opposite sides of said junction,
(c) a space discharge device one of whose electrodes is the wall of said envelope electrically connected in series with said diode, said one electrode of said space discharge device being physically spaced from one of said portions of said diode and coupled thereto solely via a space discharge path,
(d) means for applying potential between said other portion of said diode and said one electrode for exciting the flow of electrons from said other portion through said one portion and through said space discharge path to said one electrode whereby to excite the emission of radiation from said junction diode, and
(e) means for coupling microwave energy into said cavity for providing modulated field emission between said one electrode and said one portion of said junction diode.

5. A radiation emitting device comprising
(a) an envelope,
(b) a semi-conductor junction diode within said envelope having P and N portions on opposite sides of said junction, said P portion being coated with a material having secondary emissive properties,
(c) a space discharge device contained in said envelope electrically connected in series with said diode, said space discharge device having an anode electrode physically spaced from said coated P portion of said diode and coupled thereto solely via a space discharge path,
(d) means for applying potential between said N portion of said diode and said anode electrode for exciting the flow of electrons from said N portion through said coated P portion to said anode and through said space discharge path whereby to excite the emission of radiation from said junction diode, and (e) an electron gun for bombarding said coating with electrons to produce secondary electrons.

6. A radiation emitting device comprising (a) an envelope having a chamber containing an ionizable gas, (b) a semi-conductor junction diode in said envelope having P and N portions on opposite sides of said junction, a part of one of said portions projecting into said chamber, (c) a space discharge device contained in said envelope electrically connected in series with said diode, said space discharge device having one electrode physically spaced from said one portion of said diode and coupled thereto solely via a path through said ionizable gas, (d) means for applying potential between said other portion of said diode and said one electrode for exciting the flow of electrons from said other portion to said one electrode, through said one portion and said path whereby to excite the emission of radiation from said junction diode, and (e) said potential applying means providing sufficient potential to support the ionization of said gas so that electrons can propagate across the space between said one electrode and said one portion of said diode.

7. A radiation emitting device comprising (a) an envelope, (b) a semi-conductor junction diode within said envelope having P and N portions on opposite sides of said junction, (c) a space discharge device contained in said envelope electrically connected in series with said diode, said space discharge device having a collector electrode physically spaced from said P portion of said diode and coupled thereto solely via a space discharge path, (d) means for applying potential between said N portion of said diode and said collector electrode for exciting the flow of electrons from said N portion to said collector electrode through said P portion and said space discharge path whereby to excite the emission of radiation from said junction diode, and (e) an opto-electrical transducer responsive to said radiation from said junction diode for obtaining a first signal indicative of the time in which said radiation reaches said transducer, an electron optical structure providing an electron beam path from said P portion of said junction diode to said collector electrode which provides a second signal indicative of the time at which said electron beams reach said collector electrode, said collector electrode being in spaced relationship with said P portion of said junction diode such that said electrons traveling over said electron beam path from said P portion to said collector electrode have a finite propagation time, said propagation time being different from the propagation time for radiation to reach said opto-electrical transducer whereby said first and second signals delayed with respect to each other.

References Cited

UNITED STATES PATENTS

| | | | |
|---|---|---|---|
| 2,960,659 | 11/1960 | Burton | 317—235 |
| 3,245,002 | 5/1966 | Hall | 331—94.5 |
| 3,340,479 | 9/1967 | Ashkin | 331—94.5 |
| 3,387,161 | 6/1968 | Van Laar | 317—235 |

OTHER REFERENCES

Dyke: "Field Emission," Advances in Electronics and Electron Physics, vol. III, Academic Press, New York, 1956, pp. 90 and 91 relied on.

Lax: "Scanatron—A Scanning Beam Semiconductor Laser," Solid State Design, vol. 6, March, 1965, pp. 19–23.

RONALD L. WIBERT, Primary Examiner

E. BAUER, Assistant Examiner

U.S. Cl. X.R.

317—235; 313—108, 336; 356—156; 331—94.5